United States Patent [19]
Coehoorn et al.

[11] Patent Number: 6,075,361
[45] Date of Patent: Jun. 13, 2000

[54] DEVICE FOR DETECTING A MAGNETIC FIELD

[75] Inventors: Reinder Coehoorn, Eindhoven, Netherlands; Jacques C. S. Kools, Fremont, Calif.

[73] Assignee: U.S. Philips Corporation, New York, N.Y.

[21] Appl. No.: 08/977,983

[22] Filed: Nov. 25, 1997

[30] Foreign Application Priority Data

Dec. 4, 1996 [EP] European Pat. Off. .............. 96203430

[51] Int. Cl.[7] .......................... G01R 33/09; G01R 33/02; H01L 43/08
[52] U.S. Cl. ............................................. 324/252; 324/225
[58] Field of Search .............................. 324/252, 207.21, 324/207.12, 225; 338/32 R

[56] References Cited

FOREIGN PATENT DOCUMENTS

WO9528649  10/1995  WIPO .
WO9607926  3/1996  WIPO .

Primary Examiner—Walter E. Snow
Attorney, Agent, or Firm—Robert J. Kraus

[57] ABSTRACT

The device comprises a Wheatstone bridge with at least four magnetoresistive elements (1a, 1b, 1c, 1d) on a substrate (15), each magnetoresistive element comprising at least one sensitive portion (13) comprising successively a first ferromagnetic layer (19) having a magnetic easy axis (27) extending in a first direction, a non-magnetic layer (21) and a second ferromagnetic layer (23) having a magnetic easy axis (29) extending in a second direction that is different from the first direction. The sensitive portions (13) have mutually parallel sensitive directions that are parallel to a third direction (X). Each magnetoresistive element (1a, 1b, 1c, 1d) is associated with a current conductor (35a, 35b, 35c, 35d) provided in the immediate vicinity of that magnetoresistive element. The first direction (27) is canted through an acute angle with respect to the third direction (X), and the second direction (29) is canted in the opposite sense through an acute angle with respect to the third direction. Each one of the current conductors (35a, 35b, 35c, 35d) extends over at least a portion of its length in a fourth direction (Y) perpendicular to the third direction (X).

6 Claims, 5 Drawing Sheets

DEVICE FOR DETECTING A MAGNETIC FIELD

BACKGROUND OF THE INVENTION

1. Field of the Invention

The invention relates to a device for detecting a magnetic field, comprising a Wheatstone bridge with at least four magnetoresistive elements on a substrate, each magnetoresistive element comprising at least one sensitive portion comprising successively a first ferromagnetic layer having a magnetic easy axis extending in a first direction, a non-magnetic layer and a second ferromagnetic layer having a magnetic easy axis extending in a second direction that is different from the first direction, said sensitive portions having mutually parallel sensitive directions that are parallel to a third direction, each magnetoresistive element being associated with a current conductor provided in the immediate vicinity of that magnetoresistive element.

2. Description of Related Art

A device of this kind is known from WO-A-95/28649 (PHN 14.825). In the known device the first ferromagnetic layer exhibits uni-axial anisotropy in one direction due to its growth in a magnetic field. The magnetization of the second ferromagnetic layer is determined by exchange interaction with an antiferromagnetic layer provided on the second ferromagnetic layer. This interaction effectively results in uni-directional anisotropy of the second ferromagnetic layer. During manufacturing of the known device the second ferromagnetic layer and the antiferromagnetic layer are exposed, at a temperature higher than the blocking temperature, to a magnetic field which is generated by an electric current flowing in the current conductors, after which the temperature of the layers is lowered to a value below the blocking temperature whereas the magnetic field is sustained. This step fixes the direction of the effective anisotropy of the second ferromagnetic layer during the production, and hence the sensitivity of each magnetoresistive element in the Wheatstone bridge. In fact the Wheatstone bridge is programmed by this step to be sensitive for fields in a predetermined direction. The blocking temperature is the temperature at which the exchange bias field of the second ferromagnetic layer is substantially zero. The blocking temperature of, for example a suitable FeMn alloy is 140° C. Consequently, the programming of the Wheatstone bridge requires a heat treatment and the device is thermally stable only sufficiently well below the blocking temperature.

For measurements of small static magnetic fields, a trimmer resistor has to be connected in series with at least one of the magnetoresistive elements of the known device. The value of this trimmer resistor is adjusted during manufacture of the device in order to compensate for unbalance of the bridge caused by deviations of the elements in the bridge relative to one another. This is a time-consuming and expensive operation.

BRIEF SUMMARY OF THE INVENTION

It is an object of the invention to provide a device of the kind set forth in which it is possible to program the Wheatstone bridge at room temperature and in which compensation for unbalance of the bridge can be achieved easily during operation and without the use of trimming resistors. To achieve this object the device in accordance with the invention is characterized in that the first direction is canted through an acute angle with respect to the third direction, and that the second direction is canted in the opposite sense through an acute angle with respect to the third direction, each one of said current conductors extending over at least a portion of its length in a fourth direction perpendicular to the third direction. The device in accordance with the invention makes use of a magnetoresistive material that is known per se from WO-A-96/07926 (PHN 14.992). The inventors have discovered that this material can be used with advantage in a device comprising a Wheatstone bridge if the direction in which the current conductors extend is chosen to be perpendicular to the sensitive direction of the magnetoresistive elements. The material used in the device according to the invention does not comprise an antiferromagnetic layer on top of the second ferromagnetic layer and, consequently, there is no blocking temperature. As a result, the device according to the invention can be programmed at room temperature by making a current flow through the current conductors that generates oppositely directed magnetic fields at the location of magnetoresistive elements that are arranged in adjacent branches of the Wheatstone bridge. This can be achieved easily by connecting the current conductors so that the currents flowing in current conductors associated with magnetoresistive elements that are arranged in adjacent branches of the bridge flow in opposite senses. A further advantage of the device according to the invention is that the thermal stability is not limited by the blocking temperature of approximately 140° C. The limiting factors are expected to be interface and grain boundary diffusion processes which become appreciable above approximately 250° C.

Unbalance in the bridge can be compensated for very easily by reversing the sense of the current so that the programming is reversed. This technique is known per se from devices for detecting magnetic fields that use the anisotropic magnetoresistance effect. It is known as flipping.

As stated above, for achieving the primary objects of the invention it is sufficient to connect the current conductors such that currents flow in opposite senses in current conductors associated with elements in adjacent branches of the Wheatstone bridge. For some applications, however, it is desirable to generate a magnetic field that is equal in magnitude to the field to be measured and that has the opposite direction. The magnetoresistive elements then experience a magnetic field that is approximately zero. This can be achieved by having current conductors that generate the same magnetic field in the immediate vicinity of each magnetoresistive element. The current flowing through these conductors can then be measured in order to determine the magnitude of the magnetic field to be detected. This could be achieved by adding current conductors that are all connected in series. However, an embodiment of the device according to the invention in which this extra function is obtained without adding extra current conductors is characterized in that switching means are provided for connecting the current conductors to a source of electric energy according to at least a first and a second connection scheme, in the first connection scheme the current conductors being arranged such that currents flowing in current conductors associated with magnetoresistive elements that are arranged in adjacent branches of the Wheatstone bridge have opposite senses, in the second connection scheme the current conductors being arranged such that currents flowing in all current conductors have the same sense.

An embodiment of the device according to the invention is characterized in that the sensitive portions are strip-shaped structures extending in directions that are parallel to the third direction. This embodiment has the advantage that the device can be very compact.

A further embodiment is characterized in that the sensitive portions are substantially circular or oval structures, the sensitive portions of each magnetoresistive element being electrically interconnected such that a current flowing through the magnetoresistive element flows through the sensitive portions in a direction perpendicular to their sensitive directions. This embodiment has the advantage that it has an increased sensitivity compared to the previously mentioned embodiment.

BRIEF DESCRIPTION OF THE DRAWINGS

These and other aspects of the invention will be apparent from the embodiments described hereinafter.

DETAILED DESCRIPTION OF THE INVENTION

Figure 1:
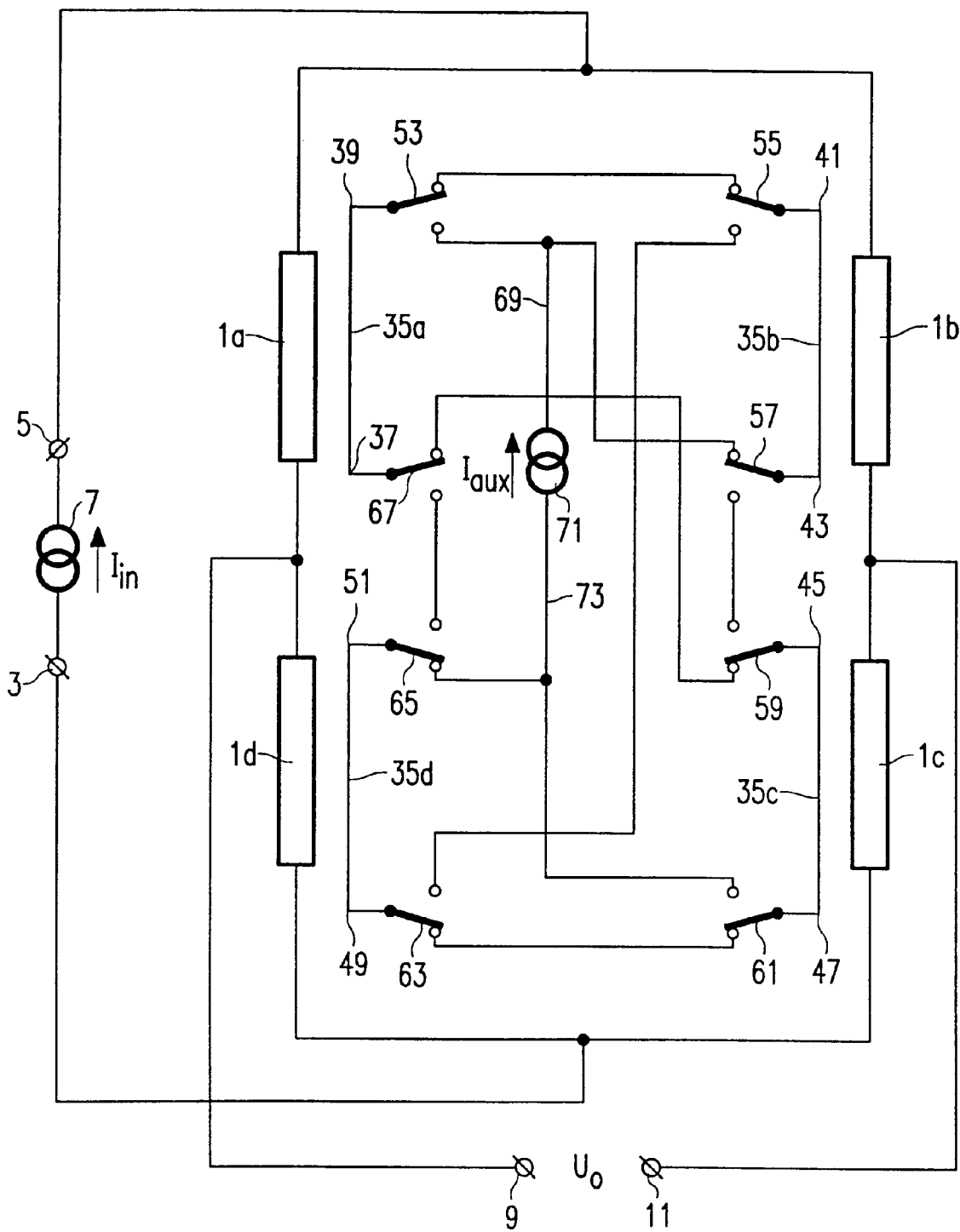
FIG. 1 shows a simplified circuit diagram of those parts of a device for detecting a magnetic field that are important for understanding the invention.

The device that is shown partly in FIG. 1 comprises four magnetoresistive elements 1a,1b,1c,1d that are connected so as to form a Wheatstone bridge with power supply terminals 3 and 5 that are connected to a current source 7 providing a current $I_{in}$. The bridge produces an output voltage $U_o$ that is available at output terminals 9 and 11. Instead of the current source 7 a voltage source could be used for supplying power to the bridge. Each magnetoresistive element 1a, . . . ,1d comprises one or more sensitive portions that have an electrical resistivity that depends on the value and direction of a magnetic field to which the sensitive portion is exposed.

Figure 2:
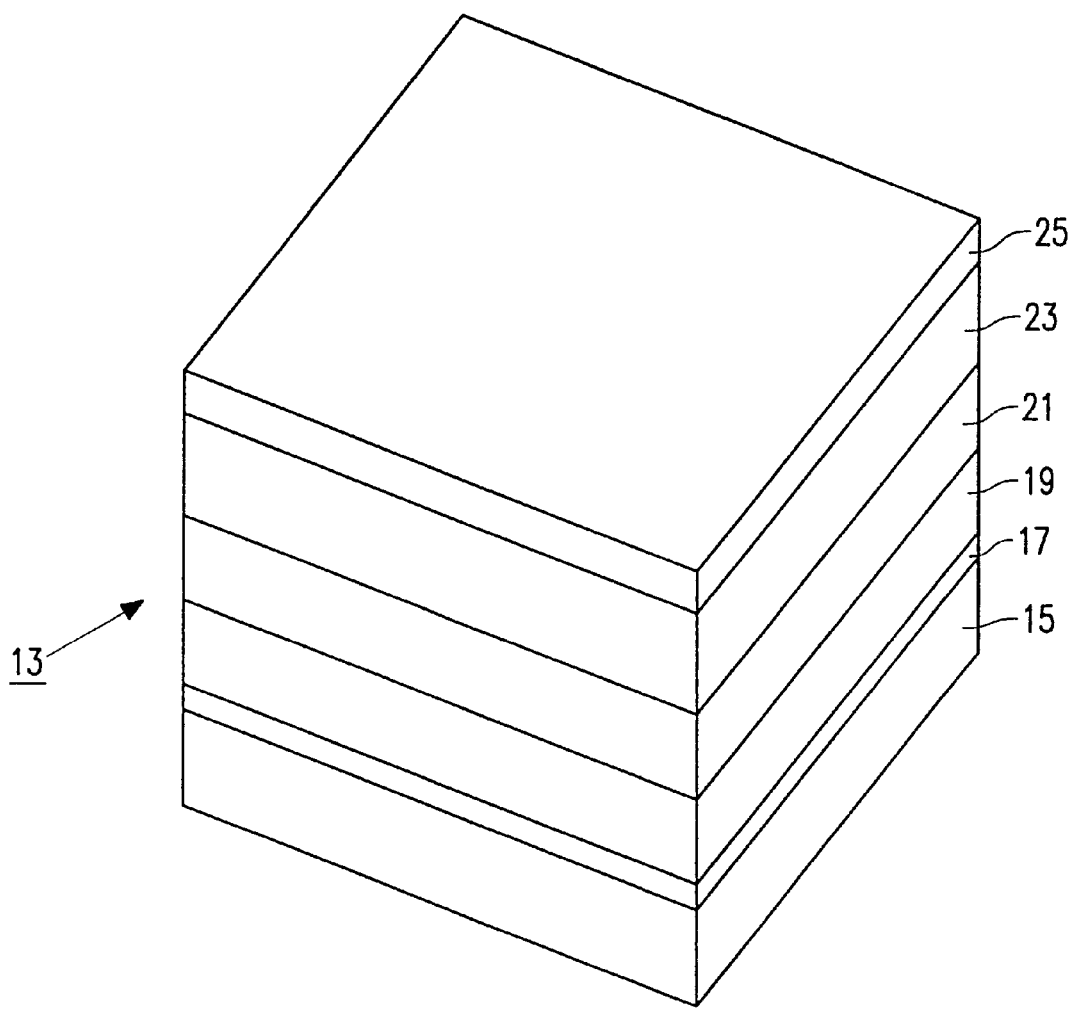
FIG. 2 shows a perspective view of a multilayer structure that forms part of magnetoresistive elements used in the device shown in FIG. 1.
Figure 2:
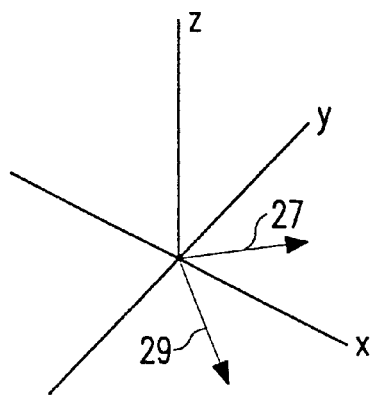

FIG. 2 shows a perspective view of the structure of one of the sensitive portions 13. This structure is known per se from WO 96/07926 (PHN 14.992). This structure can be obtained, for example, by successively depositing on a high-resistance silicon substrate 15: a first Ta layer 17, a first ferromagnetic layer 19 (for example FeNi), a non-magnetic layer 21 (for example Cu), a second ferromagnetic layer 23 (similar to the first ferromagnetic layer), and a second Ta layer 25. The first Ta layer 17 stimulates defect-free growth with a strong crystallographic structure and the second Ta layer 25 serves to protect the structure against oxidation. During the growth of each one of the ferromagnetic layers 19 and 23 a magnetic field is applied that defines the direction of a magnetic easy axis of the layer. The direction of the applied field during the growth of the second ferromagnetic layer 23 is different from the direction of the field during the growth of the first ferromagnetic layer 19. As a result, the easy axis 27 of the first ferromagnetic layer 19 extends in a first direction and the easy axis 29 of the second ferromagnetic layer 23 extends in a second direction. As shown in the co-ordinate system at the bottom of FIG. 2, the first direction is different from the second direction. In relation to this co-ordinate system the layers 17–25 extend parallel to the X–Y plane and the direction of growth of the layers is the Z-direction. The first and second directions 27 and 29 are parallel to the X–Y plane and are canted in opposite senses through acute angles with respect to the X-axis.

Figure 3:
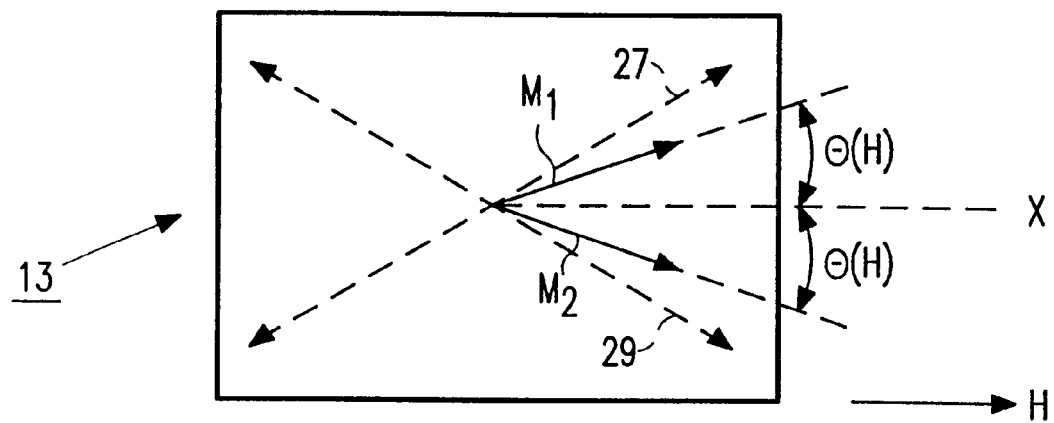
FIG. 3 is a plan view of the multilayer structure shown in FIG. 2.

FIG. 3 is a plan view of the multilayer structure shown in FIG. 2 in which the X-axis and the magnetic easy axes 27 and 29 are shown. The magnetic easy axis 27 of the first ferromagnetic layer 19 is canted anti-clockwise with respect to the X-axis and the magnetic easy axis 29 of the second ferromagnetic layer 23 is canted clockwise with respect to the X-axis. In this embodiment the angles through which the easy axes 27 and 29 are canted have the same magnitude but, as explained in WO-A-96/07926, these angles could be different. The first and second ferromagnetic layers 19, 23 can be magnetised by temporarily placing them in a magnetic field that has a component parallel to the X-axis. When this programming field is directed parallel to the positive X-direction (to the right in FIG. 3) the resulting magnetisation vectors have a component in the positive X-direction. When the programming field is directed in the negative X-direction the magnetisation vectors have a component in the negative X-direction. The magnetisation vector $M_1$ of the first ferromagnetic layer encloses an angle θ with the X-axis and the magnetisation vector $M_2$ of the second ferromagnetic layer encloses with the X-axis an angle that has the same value θ but the opposite sense. When a magnetic field H is applied to the device in a direction parallel to the X-axis, the magnetisation vectors $M_1$ and $M_2$ are rotated in opposite senses towards the X-axis so that the value of the angle θ decreases. The variation with the field H of the angle θ depends on the strength of the mangetocrystalline anisotropy of the ferromagnetic layers 19 and 23, the exchange coupling between the two layers across the non-ferromagnetic layer 21, and the magnetostatic coupling between the two layers. As a result of the rotation of the magnetisation vectors $M_1$ and $M_2$ the resistance of a magnetoresistive element 1a, . . . ,1d including one or more sensitive portions having a structure as shown in FIG. 2 varies as a function of the applied magnetic field H. This effect is due to the superposition of the giant magnetoresistance (GMR) effect and the anisotropic magnetoresistance (AMR) effect, and is to a very good approximation given by:

$$R=R(\theta=0)+\Delta R_{GMR}\tfrac{1}{2}(1-\cos 2\theta)-\Delta R_{AMR}(1-\cos^2 \theta) \quad (1)$$

(if the current flowing through the magnetoresistive element is parallel to the sensitive direction x)
and $$R=R(\theta=0)+\Delta R_{GMR}\tfrac{1}{2}(1-\cos 2\theta)+\Delta R_{AMR}(1-\cos^2 \theta) \quad (2)$$

(if the current flowing through the magnetoresistive element is perpendicular to the sensitive direction x).

Figure 4:
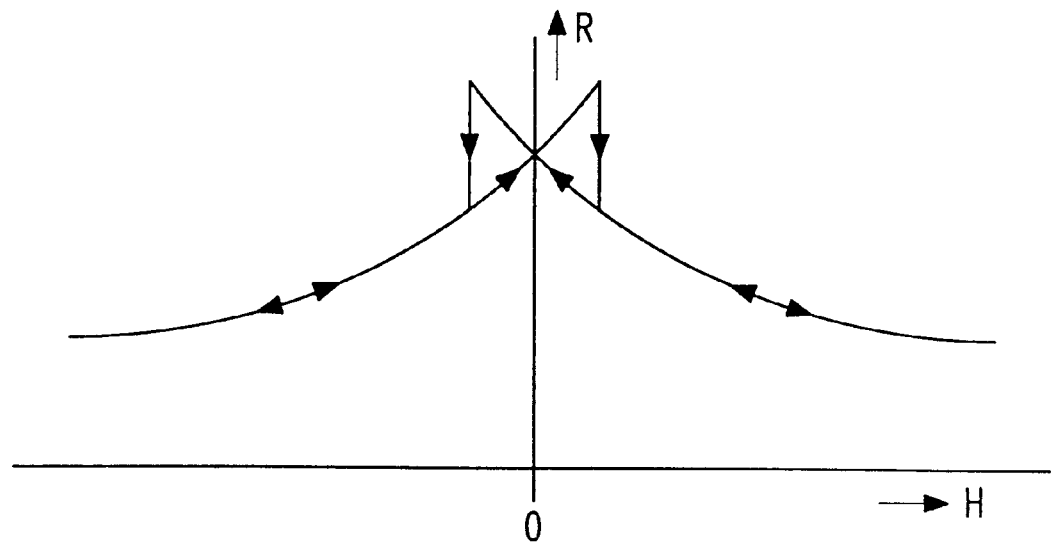
FIG. 4 shows a characteristic of a magnetoresistive device comprising the multilayer structure shown in FIGS. 2 and 3.

The resistance versus field characteristic of the described device is shown in FIG. 4 (for $\Delta R_{AMR}$=0). It is a symmetrical characteristic that has two branches, with opposite slopes at H=0.

Figure 5:
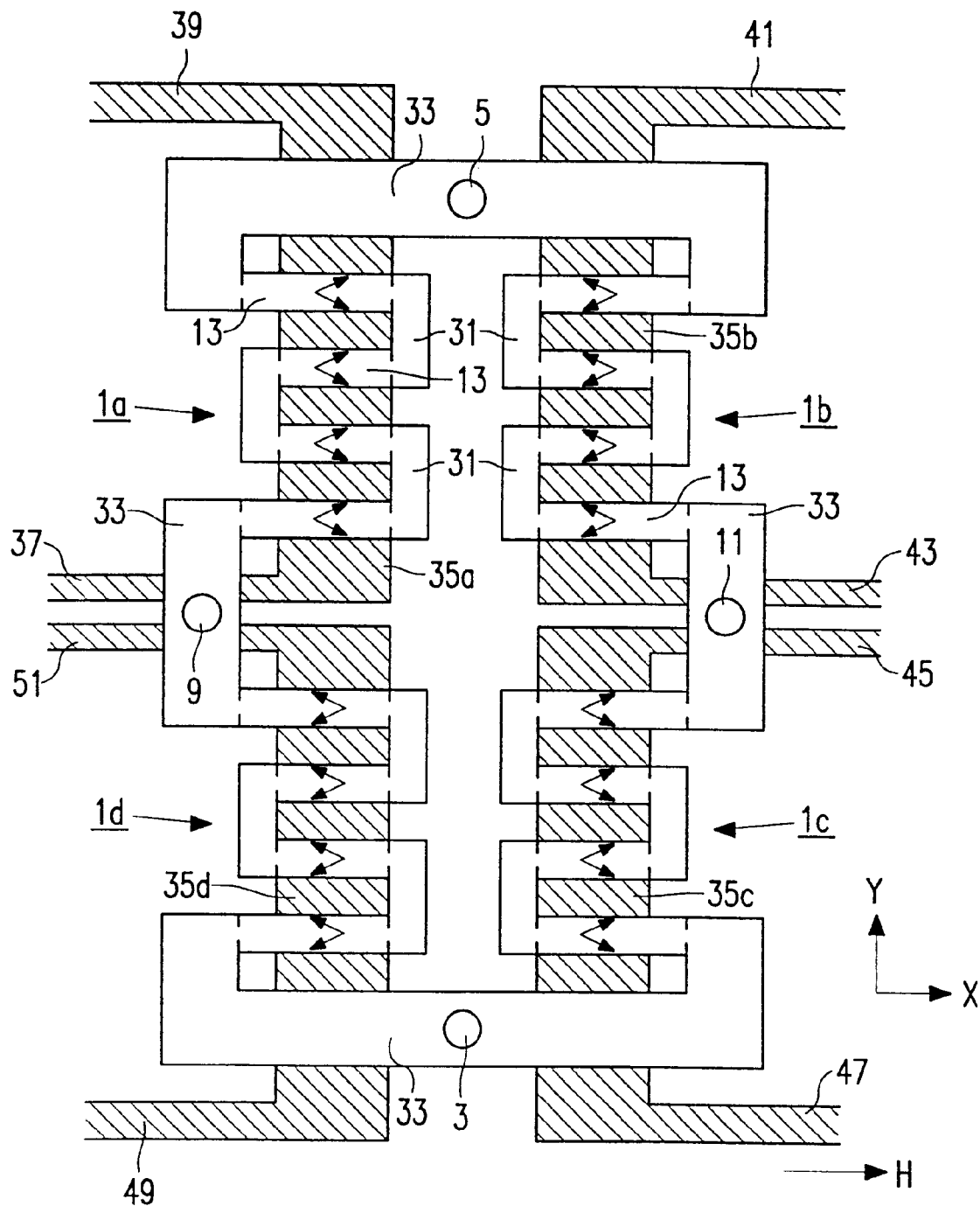
FIG. 5 shows a first embodiment of the structure of a Wheatstone bridge that is part of the device shown in FIG. 1.

FIG. 5 shows a first embodiment of the structure formed by the magnetoresistive elements 1a, . . . ,1d and the current conductors associated with these elements. The structure is formed e.g. by thin film deposition on an electrically insulating substrate. Each magnetoresistive element 1a, . . . ,1d comprises a plurality of sensitive portions 13 having substantially the composition shown in FIG. 2. The sensitive portions 13 are electrically connected in series by connecting portions 31 that may comprise, for example, a copper layer. For the sake of clarity, the connecting portions 31 are separated from the sensitive portions 13 by dotted lines in FIG. 5. The four magnetoresistive elements $1a, \ldots, 1d$ formed in this way are interconnected by conductor strips 33 so as to form a Wheatstone bridge. The conductor strips 33 may have the same composition as the connecting portions 31. On the conductor strips 33 locations are provided that form the terminals 3, 5 and 9, 11 shown in FIG. 1. Electrical conductors, such as copper wires, may be connected to these terminals, e.g. by soldering. The four magnetoresistive elements $1a, \ldots, 1d$ are structurally identical with, however, pairwise different directions of the magnetisation vectors in the H=0 state (indicated by arrows in the sensitive portions 13). The directions of the magnetisation vectors are chosen such that magnetoresistive elements that are located in adjacent branches of the Wheatstone bridge (such as, for example the elements $1a$ and $1b$ or $1b$ and $1c$) have different directions of the magnetisation vectors. The elements $1a, \ldots, 1d$ are sensitive for magnetic fields having the direction shown in FIG. 5 or the opposite direction (i.e. fields directed along the X-axis). An applied magnetic field H causes a bridge imbalance which is detected by a voltage $U_o$ across the output terminals 9, 11 if a current $I_{in}$ is flowing between the power supply terminals 3, 5.

In the immediate vicinity of each magnetoresistive element $1a, \ldots 1d$ there is provided a current conductor $35a,35b,35c,35d$. The current conductors $35a, \ldots 35d$ (shown shaded) may be situated below the magnetoresistive elements $1a, \ldots, 1d$ as shown in FIG. 5 or above these elements. They are separated from the associated magnetoresistive elements $1a, \ldots, 1d$ by an electrically insulating layer (not shown). The first current conductor $35a$ has first and second end portions 37 and 39, the second current conductor $35b$ has first and second end portions 41 and 43, the third current conductor $35c$ has first and second end portions 45 and 47, and the fourth current conductor $35d$ has first and second end portions 49 and 51.

A current flowing through, for example, the first current conductor $35a$ generates a magnetic field at the location of the first magnetoresistive element $1a$. If the current flows in the Y-direction, this magnetic field is directed parallel to the X-axis. If this magnetic field has a sufficient magnitude, it can define the direction of the magnetisation vectors $M_1$ and $M_2$ in the sensitive portions 13 of the element $1a$ as explained above. The direction of the magnetisation vectors in each one of the magneto-resistive elements $1a, \ldots, 1d$ thus depends on the direction of the current in the associated current conductor $35a, \ldots, 35c$. Consequently, the current conductors $35a, \ldots, 35d$ can be used for programming the magnetoresistive elements $1a, \ldots, 1d$. For this purpose the currents through the first and third current conductors $35a$ and $35c$ should have a first sense and the current through the second and fourth current conductors $35b$ and $35d$ should have a second sense opposite to the first sense.

When DC magnetic fields have to be measured with a high sensitivity, the temperature dependence of the resistance of the magnetoresistive elements $1a, \ldots, 1d$ has a negative influence on the accuracy of the measurement. It is known in the art to compensate for this thermal drift by first performing a measurement of the magnetic field while the magnetoresistive elements $1a$ and $1c$ increase their resistance if the magnetic field H is directed along, for example, the positive X-direction, and subsequently performing a similar measurement when these magnetoresistive elements increase their resistance for magnetic fields H directed along the negative X-direction. By subtracting the results of the two measurements the effect of thermal drift can be eliminated. This technique is known as flipping the sensitivity of the magnetoresistive elements. In the device shown in FIG. 5, flipping can be achieved very easily by making a current flow through each one of the current conductors $35a, \ldots$ ,$35d$ that has a sense opposite to the sense of the current used for programming the device. The effect of this is that the device is reprogrammed with a reversed sensitivity.

The programming and flipping functions of the current conductors $35a, \ldots, 35d$ as described above can be achieved by connecting these current conductors in series so that the same current always flows through all four current conductors, the current sense in the first and third current conductors $35a$ and $35d$ being the same and opposite to the current sense in the second and fourth current conductors $35c$ and $35d$. For this purpose the end portions of the current conductors could be connected in the following manner: 39 to, 41, 37 to 45, and 47 to 49. The remaining end portions 43 and 51 could then be connected to terminals of a DC current source having a reversible polarity. These connections could be made permanent.

In some cases it is desirable to measure magnetic fields H in such a manner that the Wheatstone bridge is always in equilibrium, the output voltage $U_o$ always being zero. This can be achieved by applying a compensating magnetic field to the magnetoresistive elements $1a, \ldots, 1d$ that has the same value as the field H but the opposite sense. Such a compensating field can be generated by means of one or more current conductors in the vicinity of the magnetoresistive elements $1a, \ldots, 1d$. The current that is necessary to obtain equilibrium of the bridge depends on the magnitude of the magnetic field H. By measuring this current, the magnitude of H can be measured. It has been discovered that in the device in accordance with the invention the current conductors $35a, \ldots, 35d$ can be used for generating the compensating field. For this purpose the current through all four current conductors $35a, \ldots, 35d$ must flow in the same direction. This can be achieved by connecting the end portions of these current conductors as follows: 37 to 51, 49 to 41, and 43 to 45. The remaining end portions 39 and 47 should then be connected to terminals of a controllable DC current source.

It is clear that the functions of programming and flipping require an interconnecting scheme of the current conductors that is different from the interconnecting scheme required for the function of providing a compensating field. It is, however, possible to realise both interconnecting schemes by providing suitable switching means. An embodiment of such switching means is shown in the circuit diagram of FIG. 1. In this embodiment the switching means comprise eight change-over switches 53, 55, 57, 59, 61, 63, 65 and 67. The switches 53, . . . ,67 are preferably implemented with suitable semiconductor switching elements such as bipolar of field-effect transistors. They are controlled in a known manner by a control unit (not shown). The switches 53, . . . ,67 can switch between two positions. In the positions shown in FIG. 1 the switches interconnect the end portions of the current conductors as follows: switches 53 and 55 interconnect the end portions 39 and 41, switches 67 and 59 interconnect the end portions 37 and 45, switches 61 and 63 interconnect the end portions 47 and 49, switch 57 connects the end portion 43 to a first terminal 69 of a current source 71 and switch 65 connects the end portion 51 to the second terminal 73 of the current source. The current source 71 provides a DC current $I_{aux}$ and comprises means for reversing the sense of this current upon receiving a suitable command from the control unit. With the switches 53, . . . ,67 in the positions shown in FIG. 1 the functions of programming and flipping can be performed.

When the switches 53, . . . ,67 have the positions not shown in FIG. 1 they interconnect the end portions of the current conductors $35a, \ldots, 35d$ as follows: switches 65 and 67 interconnect the end portions 37 and 51, switches 63 and 55 interconnect the end portions 49 and 41, switches 57 and 59 interconnect the end portions 43 and 45, switch 53 connects the end portion 39 to the first terminal 69 of the current source 71 and switch 61 connects the end portion 47 to the second terminal 73. With the switches 53, . . . ,67 in these positions the function of providing a compensating field can be provided. In the arrangement shown in FIG. 1 the same current source 71 is used for all functions. It is, of course, also possible to use a different current source for providing a compensating field.

Figure 6:
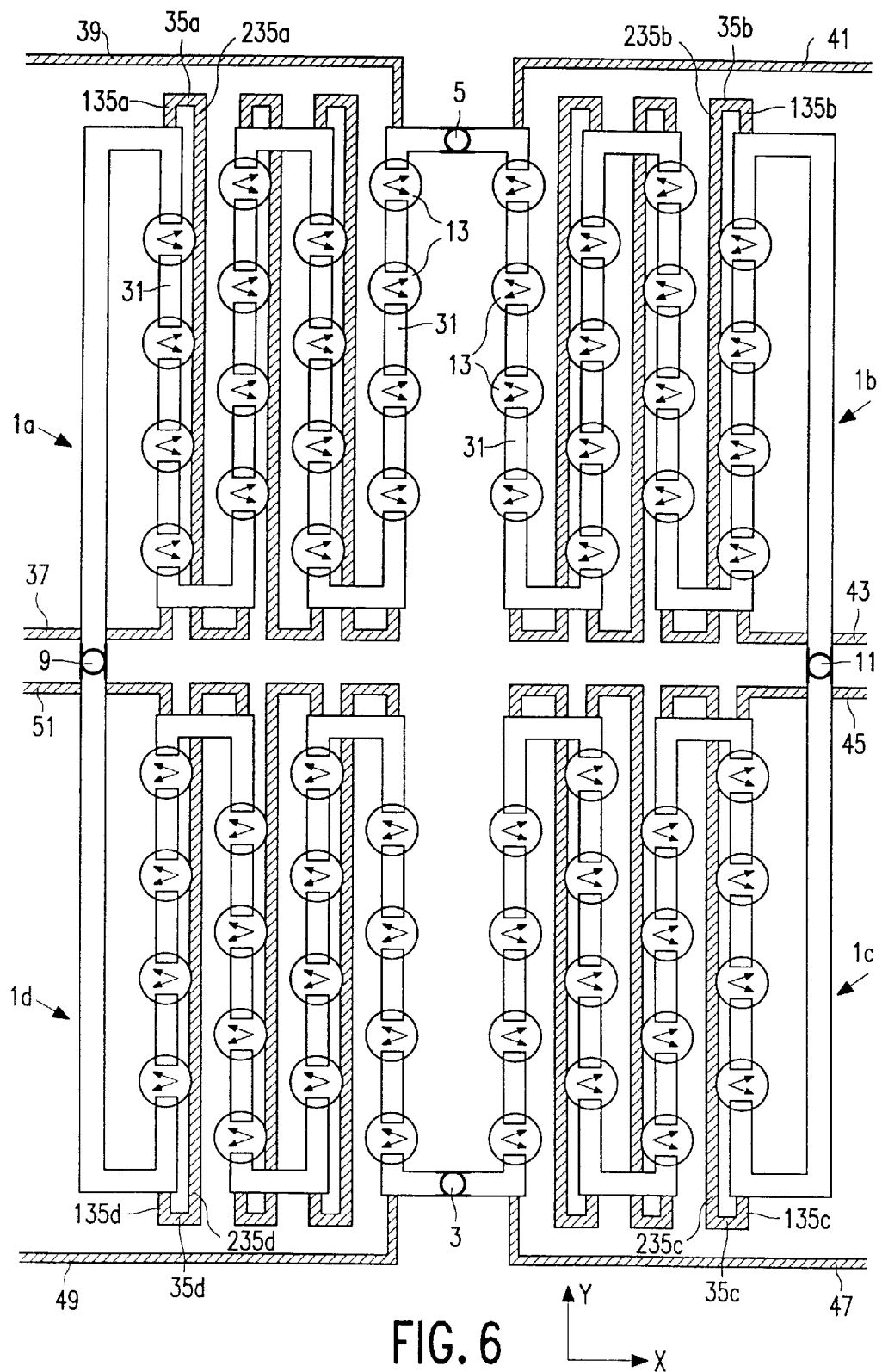
FIG. 6 shows a second embodiment of the structure of the Wheatstone bridge that is part of the device shown in FIG. 1.

In the first embodiment shown in FIG. 5 the sensitive portions 13 of the magnetoresistive elements 1a, . . . ,1d are strip-shaped structures that extend in the X-direction, i.e. the sensitive direction. As shown in the Figure, the sensitive portions 13 are parallel with relatively small distances between adjacent sensitive portions of one magnetoresistive element. As a result, the device can be very compact. Therefore, this embodiment is very suitable if only little room is available for the sensor. In this configuration the current through the sensitive portions is parallel to the sensitive direction. From equation (1) it follows that in this case the GMR and AMR effects have opposite signs. If a very high sensitivity of the device is required, it would be an advantage to make the current flow perpendicular to the sensitive direction so that, in accordance with equation (2), the GMR and AMR effect would add constructively. This situation is achieved in a second embodiment shown in FIG. 6. In this second embodiment the sensitive portions 13 are substantially circular structures (alternatively they could be oval) that are electrically interconnected by the connecting portions 31 in such a manner that a current flowing through one of the magnetoresistive elements 1a, . . . ,1d flows through the sensitive portions in a direction that is perpendicular to the sensitive direction of these portions. As a result, equation (2) applies to these magnetoresistive elements. The sensitive direction of the sensitive portions is defined by the direction of the magnetisation vectors of these portions which is indicated by means of arrows in the same manner as in FIG. 5. As in the first embodiment, the sensitive direction is parallel to the X-direction. In order to reduce the surface area required for the sensor the magneto-resistive elements 1a, . . . ,1d in both the first and the second embodiment are shaped as meanders. In the first embodiment each strip-shaped sensitive portion 13 may have a considerable length so that a relatively small number of such portions may be aligned along a line parallel to the Y-direction which is perpendicular to the sensitive direction. Consequently, a single current conductor 35a, . . . ,35d extending parallel to the Y-direction is sufficient for each magnetoresistive element 1a, . . . ,1d. In the second embodiment, a relatively large number of dot-like portions is necessary for each magnetoresistive element and the meander-shaped element comprises a plurality of parallel rows, each row comprising a plurality of sensitive portions 13. Because the magnetic field generated by the current conductor associated with a given magnetoresistive element must have the same direction for all sensitive portions of that element, each current conductor 35a, 35b, 35c, 35d comprises a plurality of active portions 135a, 135b, 135c, 135d interconnected by inactive portions 235a, 235b, 235c, 235d. Each one of the active portions corresponds to and is located below (or above) a corresponding row of sensitive portions, the inactive portions being located between the rows of sensitive portions. As a result, a magneto-resistive element of the second embodiment occupies more surface area than a magneto-resistive element of the first embodiment. As a refinement, the dot-like sensitive portions 13 of the second embodiment may be placed in a hexagonal pattern in order to minimize mutual interactions. A similar proposal has been made for the device disclosed in WO-A-95/28649.

The sensitive portions 13 (whether they are dot-like or not) may be chosen so small that they are single-domain portions.

What is claimed is:

1. A device for detecting a magnetic field, comprising:

a Wheatstone bridge with at least four magnetoresistive elements on a substrate, each magnetoresistive element comprising:
at least one sensitive portion comprising successively
a first ferromagnetic layer having a magnetic easy axis extending in a first direction,
a non-magnetic layer and
a second ferromagnetic layer having a magnetic easy axis extending in a second direction that is different from the first direction,
said sensitive portions having mutually parallel sensitive directions that are parallel to a third direction, each magnetoresistive element being associated with a current conductor provided in the immediate vicinity of that magnetoresistive element, characterized in that:

the first direction is canted through an acute angle with respect to the third direction, the second direction is canted in the opposite sense through an acute angle with respect to the third direction, and each one of said current conductors extends over at least a portion of its length in a fourth direction perpendicular to the third direction.

2. A device as claimed in claim 1, characterized in that switching means are provided for connecting the current conductors to a source of electric energy according to at least a first and a second connection scheme, wherein:
in the first connection scheme the current conductors are arranged such that currents flowing in current conductors associated with magnetoresistive elements that are arranged in adjacent branches of the Wheatstone bridge have opposite senses, and
in the second connection scheme the current conductors are arranged such that currents flowing in all current conductors have the same sense.

3. A device as claimed in claim 1, characterized in that the sensitive portions are strip-shaped structures extending in directions that are parallel to the third direction.

4. A device as claimed in claim 1 characterized in that the sensitive portions are substantially circular or oval structures,
the sensitive portions of each magnetoresistive element being electrically interconnected such that a current flowing through the magnetoresistive element flows through the sensitive portions in a direction perpendicular to their sensitive directions.

5. A device as claimed in claim 2, characterized in that the sensitive portions are strip-shaped structures extending in directions that are parallel to the third direction.

6. A device as claimed in claim 2 characterized in that the sensitive portions are substantially circular or oval structures,
the sensitive portions of each magnetoresistive element being electrically interconnected such that a current flowing through the magnetoresistive element flows through the sensitive portions in a direction perpendicular to their sensitive directions.

* * * * *